United States Patent
Fujimoto

(10) Patent No.: US 7,071,026 B2
(45) Date of Patent: Jul. 4, 2006

(54) PRODUCTION METHOD FOR MAKING FILM CARRIER TAPE FOR MOUNTING ELECTRONIC DEVICES THEREON

(75) Inventor: Akira Fujimoto, Shimonoseki (JP)

(73) Assignee: Mitsui Mining & Smelting Co., Ltd., Tokyo (JP)

(*) Notice: Subject to any disclaimer, the term of this patent is extended or adjusted under 35 U.S.C. 154(b) by 42 days.

(21) Appl. No.: 10/735,166

(22) Filed: Dec. 12, 2003

(65) Prior Publication Data

US 2004/0245109 A1 Dec. 9, 2004

(30) Foreign Application Priority Data

Dec. 13, 2002 (JP) ............... 2002-363060

(51) Int. Cl.
*H01L 21/44* (2006.01)
*H01L 21/48* (2006.01)
*H01L 21/50* (2006.01)
*C25D 5/02* (2006.01)
*H05K 3/00* (2006.01)

(52) U.S. Cl. ..................... 438/106; 205/125
(58) Field of Classification Search ............... 438/106; 257/678; 205/125
See application file for complete search history.

(56) References Cited

U.S. PATENT DOCUMENTS

| | | | | |
|---|---|---|---|---|
| 4,322,280 A | * | 3/1982 | Houska et al. | 204/207 |
| 5,039,576 A | * | 8/1991 | Wilson | 428/626 |
| 5,308,464 A | | 5/1994 | Murphy et al. | |
| 2003/0224111 A1 | * | 12/2003 | Suganuma et al. | 427/305 |

FOREIGN PATENT DOCUMENTS

| | | |
|---|---|---|
| JP | 62-007891 | 1/1987 |
| JP | 04-080398 A | 3/1992 |
| JP | 2002-246425 A | 8/2002 |
| JP | 2002-317296 A | 10/2002 |

* cited by examiner

*Primary Examiner*—Carl Whitehead, Jr.
*Assistant Examiner*—Heather A. Doty
(74) *Attorney, Agent, or Firm*—The Webb Law Firm

(57) ABSTRACT

A film carrier tape for mounting electronic devices thereon has a tin-bismuth alloy deposit in which the bismuth content in the deposit is substantially uniform along a thickness direction thereof. The film carrier tape can be produced by plating at least a part of a wiring pattern with a tin-bismuth alloy and washing the tin-bismuth alloy deposit formed by plating with a water-ejecting washing nozzle within 6 seconds after the plating is completed. A plating apparatus for use in the above production includes a washing nozzle for washing the film carrier tape within 6 seconds after the film carrier tape has exited a plating tank.

4 Claims, 5 Drawing Sheets

PRODUCTION METHOD FOR MAKING FILM CARRIER TAPE FOR MOUNTING ELECTRONIC DEVICES THEREON

FIELD OF THE INVENTION

The present invention relates to a film carrier tape for mounting electronic devices thereon in which lead portions are plated with a tin-bismuth alloy with high uniformity. The invention also relates to a production method of the film carrier tape and to a plating apparatus for use in the production method.

BACKGROUND OF THE INVENTION

Film carrier tapes, in which a number of wiring patterns are formed on a flexible insulating film, have been used for incorporating electronic devices in an apparatus. Examples of such a film carrier tape for mounting electronic devices thereon include TAB (tape automated bonding) tape, CSP (chip size package) tape, COF (chip on film) tape, BGA (ball grid array) tape and ASIC (application specific integrated circuit) tape. These film carrier tapes have inner leads to connect with terminals of electronic devices to be mounted thereon, and outer leads, which are in series with a respective inner lead, for establishing a connection with outside devices.

Some of these film carrier tapes are required to plate the outer leads with solder which is an alloy of tin and lead. Since solder contains lead which is a heavy metal, recently it has begun to be replaced with a tin-bismuth alloy under the recent global request of eliminating lead from use. An addition of bismuth lowers a melting point of tin-bismuth alloy, just like lead metal does in tin-lead (Pb) solder. Therefore, it had been thought that tin-bismuth alloy solder could be treated equally with tin-lead (Pb) solder by optimizing a content of bismuth in the alloy.

However, it was found that the melting point of the tin-bismuth alloy did not have a constant value in spite of the fact that the bismuth content in the alloy solder was always constant.

A study was made to better understand the cause of this melting point fluctuation, and it was found that bismuth content is not uniform in the alloy deposit. That is, bismuth content tends to be higher near the surface of a tin-bismuth alloy deposit, which makes the melting point of the alloy different between near the surface and deep inside of the alloy deposit. This non-uniform bismuth content distribution in the alloy deposit not only changes a melting point of the tin-bismuth alloy, but also may have an influence on the bonding properties of the leads having the alloy deposit thereon and lower a reliability of the film carrier tapes.

A study was made to investigate the cause of the non-uniformity of bismuth content in a tin-bismuth alloy solder deposit, and the following fact was found.

Tin-bismuth alloy deposit can be formed by electroplating as well as tin-lead solder deposit. Bismuth works to lower a melting point of tin-bismuth alloy as well as lead metal in solder. However, bismuth tends to substitute with tin by contact with tin in the plating solution which will not occur in case of lead.

In a plating apparatus for production of the film carrier tape, it is inevitably needed to provide a certain distance between an electroplating tank and a water-washing tank positioned downstream of the traveling direction of the film carrier tape due to structural reasons. Therefore, it is generally required about 10 seconds for the film carrier tape to enter the washing tank after exited from the electroplating tank.

The distance between the electroplating tank and the washing tank causes no problem in tin-lead solder plating where no substitution occurs between tin and lead metals. However, it will cause a problem in the plating of tin-bismuth alloy. That is, after the film carrier tape exits the electroplating tank, bismuth in the plating solution remaining on the tape will substitute with tin present near the surface of tin-bismuth alloy deposit. As a consequence, a surface of the alloy deposit will be modified because a composition in the vicinity of the surface is altered. Therefore, tin-bismuth alloy deposit will have the highest bismuth content near the surface where tin has been substituted with bismuth. Accordingly, the tin-bismuth alloy deposit will come to have different melting points in the deposit along its thickness direction.

This substitution between bismuth and tin could be prevented and as a result the tin-bismuth alloy deposit would have a uniform composition if the film carrier tape is washed in the water-washing tank immediately after carried out from the plating tank. However, the electroplating tank and the washing tank are separate devices so that no matter how close they are positioned to one another, the conveyance of the film carrier tape between them will require about 10 seconds with the plating solution remaining thereon. This is sufficient time period for the substitution to proceed between bismuth in the plating solution and tin in the alloy deposit.

The substitution between bismuth and tin must be prevented since it leads to fluctuation of a melting point of the tin-bismuth alloy. Also, it should be prevented to obtain stable properties for the film carrier tape including bonding properties.

OBJECTS OF THE INVENTION

It is an object of the invention to provide a film carrier tape for mounting electronic devices thereon, in which lead portions are provided with a tin-bismuth alloy deposit containing a substantially uniform distribution of bismuth.

It is another object of the invention to provide a production method of a film carrier tape for mounting electronic devices thereon, by which a tin-bismuth alloy deposit can be formed on lead portions with little substitution of tin in the deposit with bismuth.

It is a further object of the invention to provide a plating apparatus for use in the production of a film carrier tape for mounting electronic devices thereon, which is capable of producing a tin-bismuth alloy deposit on lead portions with little substitution of tin in the deposit with bismuth.

SUMMARY OF THE INVENTION

A film carrier tape for mounting electronic devices thereon according to the invention comprises an insulating film and a wiring pattern formed thereon at least a part of which is plated with a tin-bismuth alloy, wherein bismuth content in the tin-bismuth alloy deposit formed by plating is substantially uniform along a thickness direction thereof.

The film carrier tape may be produced by a method which comprises:

plating at least a part of a wiring pattern formed on an insulating film with a tin-bismuth alloy; and washing a portion plated with the tin-bismuth alloy within 6 seconds after the plating is completed.

In the production of the film carrier tape, a plating apparatus may be used which comprises a plating tank, a slit inlet opening through which the film carrier tape successively enters the plating tank, a slit outlet opening through which the film carrier tape exits the plating tank, and a washing nozzle for washing the film carrier tape which has exited the plating tank through the slit outlet opening.

In the production method of a film carrier tape according to the invention, the film carrier tape is washed within 6 seconds after the film carrier tape exits the plating tank to remove the plating solution which remains on the surface of the film carrier tape. By controlling the time for which the film carrier tape is subjected to contact with the plating solution within 6 seconds after exiting the plating tank, a substitution may be substantially prevented from occurring between bismuth in the plating solution and tin in a tin-bismuth alloy deposit formed at lead portions of the film carrier tape.

Accordingly, bismuth content near the surface of the tin-bismuth alloy deposit will not substantially change. Therefore bismuth content in the tin-bismuth alloy deposit is substantially uniform from the surface to the inside of the deposit along the direction of a thickness thereof.

BRIEF DESCRIPTION OF THE DRAWINGS

FIG. 5 is a partially cutaway side view showing the plating apparatus illustrated in FIG. 4, wherein:

- 10: Film carrier tape for mounting electronic devices
- 11: Insulating film
- 12: Conductive metal layer
- 13: Wiring pattern
- 15: Lead
- 15a: Inner lead
- 15b: Outer lead
- 16: Photosensitive resin
- 17: Solder resist layer.
- 17a: Pattern
- 18: Tin deposit
- 19: Tin-bismuth alloy deposit
- 20: Sprocket hole
- 22: Current supply wiring
- 40: Plating apparatus
- 41: Plating solution
- 42: Plating tank
- 43: Sidewall (upstream)
- 44: Sidewall (downstream)
- 45, 46: Longer sidewalls
- 47: Anode
- 55a: Tin metal electrode
- 55b: Insoluble anode
- 50: Slit inlet opening
- 51: Slit outlet opening
- 53: Plating electricity supplying device
- 60: Washing tank
- 61: Washing nozzle
- 62: Receiver

DETAILED DESCRIPTION OF THE INVENTION

A film carrier tape for mounting electronic devices thereon (hereinafter the "film carrier tape"), a production method thereof, and a plating apparatus suitably used in the production method will now be described in detail with reference to the attached drawings.

Figure 1:
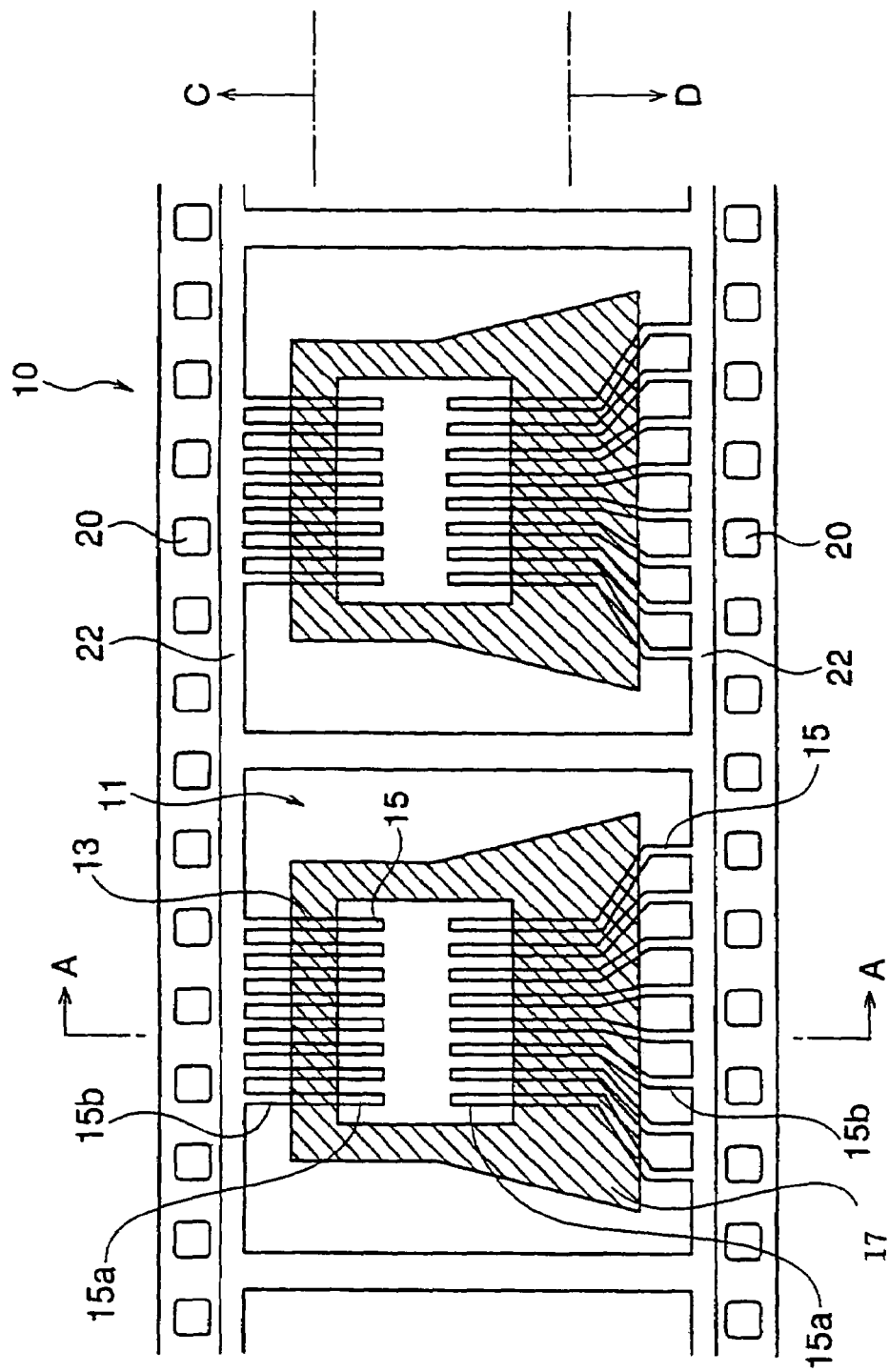
FIG. 1 is a plan view schematically showing an embodiment of the film carrier tape according to the invention.
Figure 2:
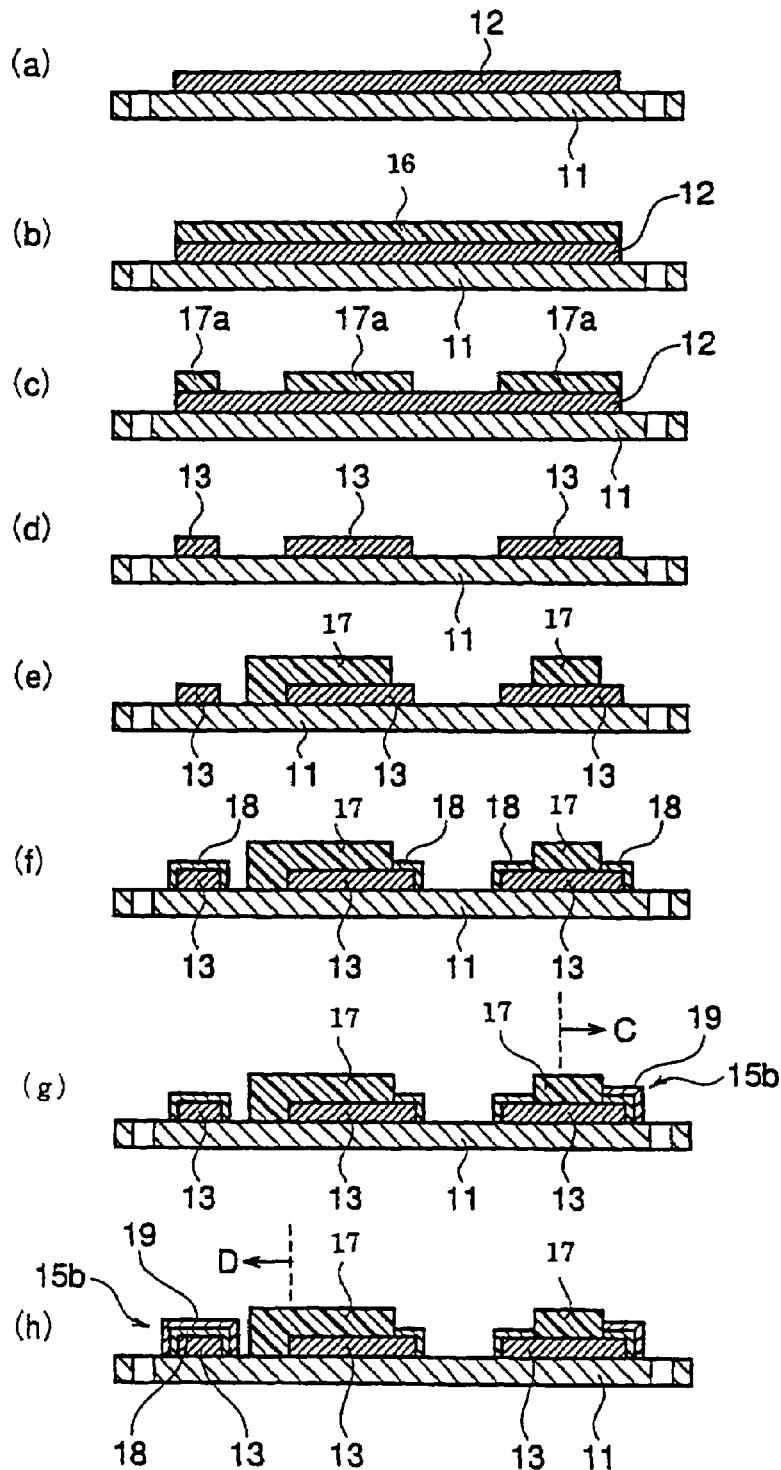
FIGS. 2(a)–2(h) are sectional views, taken on line A—A of FIG. 1, showing steps of the production of the film carrier tape according to the invention.
Figure 3:
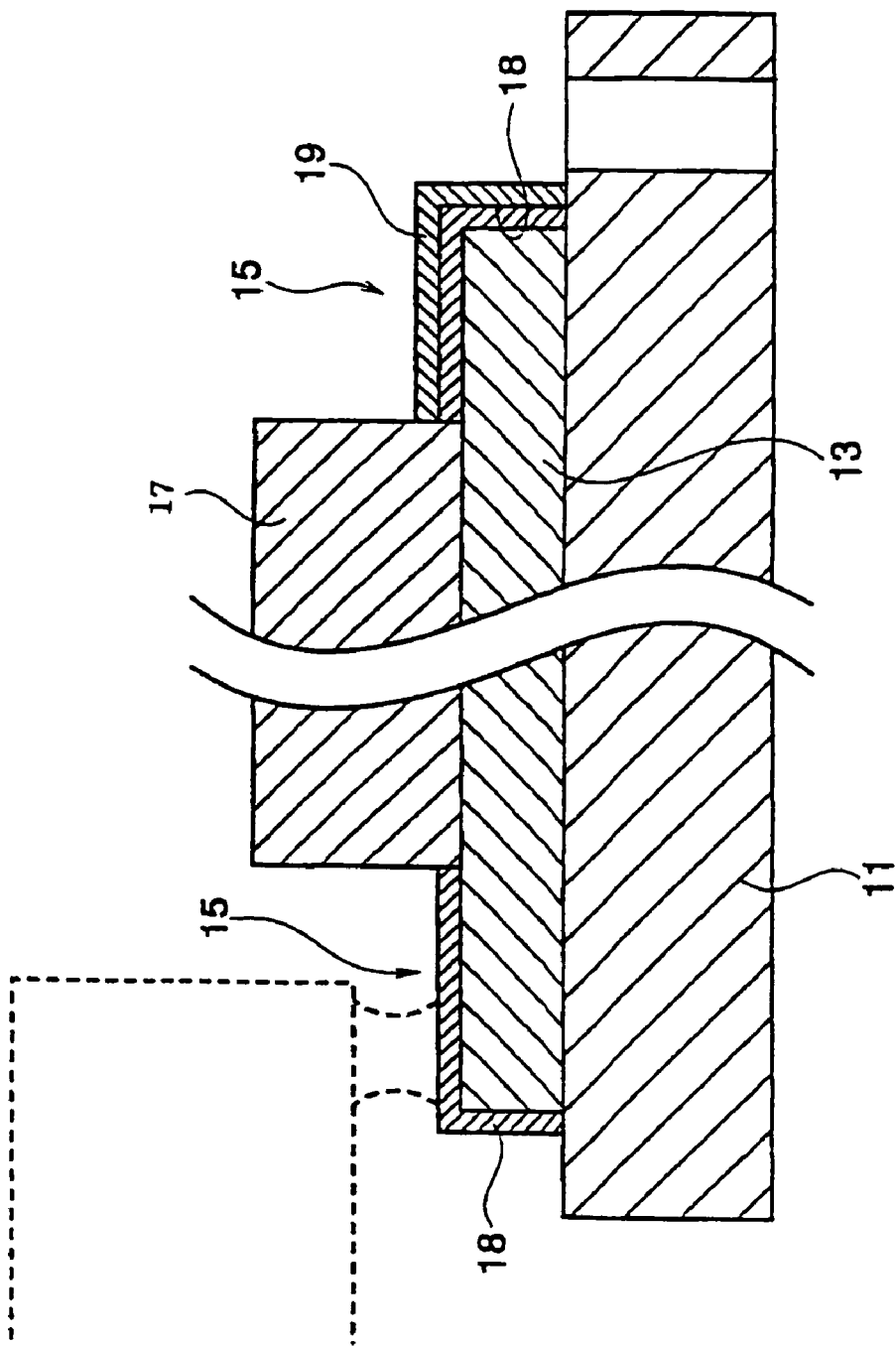
FIG. 3 is an enlarged sectional view schematically showing lead portions of the film carrier tape according to the invention.

FIG. 1 is a plan view showing an embodiment of the film carrier tape according to the invention. FIG. 2 is a set of sectional views showing steps of the production of the film carrier tape illustrated in FIG. 1. FIG. 3 is an enlarged sectional view showing a lead portion illustrated in FIG. 2.

Figure 4:
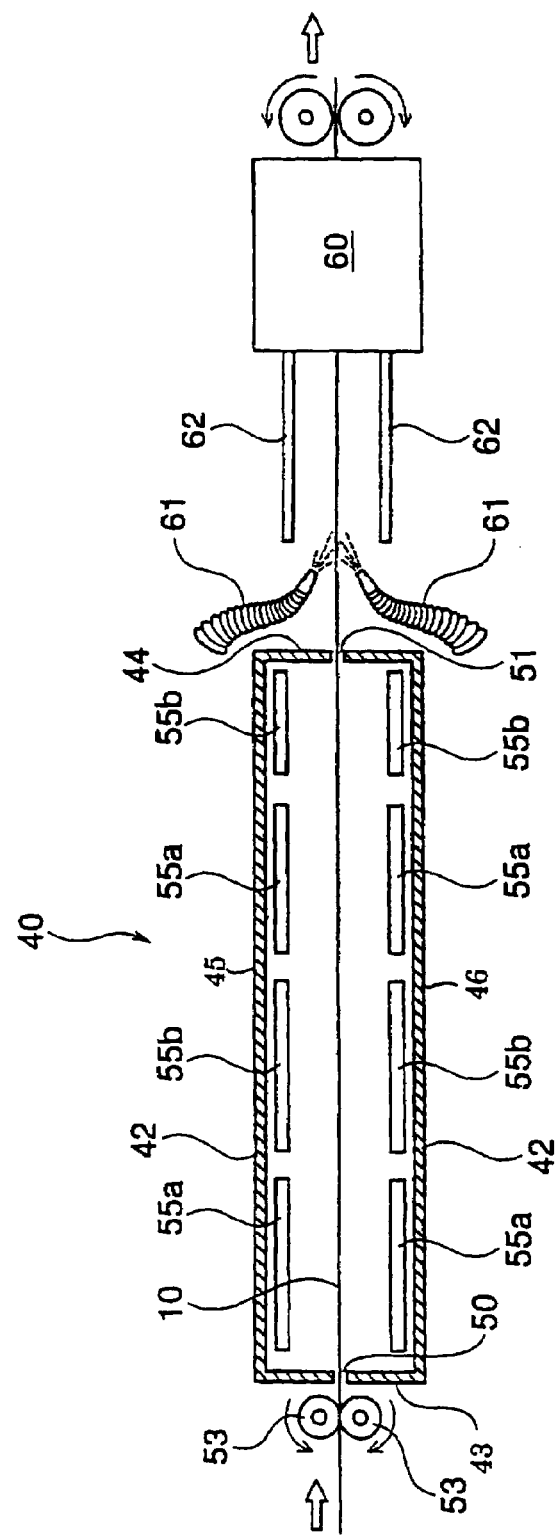
FIG. 4 is a top view showing an embodiment of the plating apparatus for use in the production of the film carrier tape according to the invention.
Figure 5:
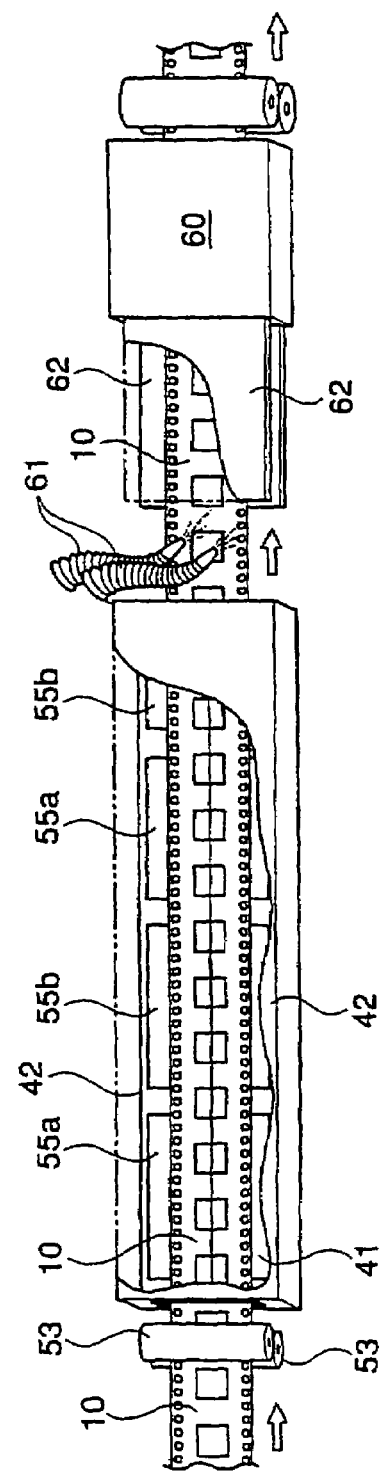

FIG. 4 is a top view showing an embodiment of the plating apparatus according to the invention. FIG. 5 is a partially cutaway side view showing the plating apparatus illustrated in FIG. 4.

As illustrated in FIGS. 1 to 2, the film carrier tape 10 comprises an insulating film 11, a wiring pattern 13 formed on the insulating film, and a solder resist layer 17 formed on the wiring pattern 13 so as to expose connection leads 15.

The insulating film 11 has a chemical resistance against chemicals, such as acids, that will contact therewith in the etching process. It also has a heat resistance so as not to be deteriorated by heat applied in the bonding process. Materials for the insulating film include polyesters, liquid crystal polymers, polyamides and polyimides. In the invention, polyimides are particularly preferably employed. Exemplary polyimides usable to form the insulating film 11 include aromatic polyimides which are generally synthesized from pyromellitic dianhydride and aromatic diamine, and aromatic polyimides having a biphenyl skeleton which are synthesized from biphenyltetracarboxylic dianhydride and aromatic diamine. In the present invention, any of these polyimides may be employed. These polyimides have prominently higher heat resistance and excellent chemical resistance than those of other resins.

In the invention, the insulating film 11, preferably a polyimide film, has an average thickness of usually 5 to 150 μm, preferably 5 to 125 μm, and particularly preferably 5 to 100 μm.

In the production of the film carrier tape, the insulating film 11 may be optionally provided with holes according to the type of the objective film carrier tape. Such holes include sprocket holes (given the referential number 20 in the drawings), through-holes for inserting solder balls, device holes, positioning holes and slits for establishing an electrical connection between the leads and electrodes of electronic devices.

A width of the insulating film 11 is not particularly limited. Since there should not be more than one film carrier across the width of the insulating film 11 in order that the plating with tin-bismuth alloy can be effected on selected portions of leads 15, the insulating film (polyimide film) 11 preferably is 35 mm wide or 70 mm wide depending on the width of the film carrier to be formed.

The insulating film 11 has a wiring pattern 13 formed on its surface. The wiring pattern 13 may be formed by selectively etching a conductive metal layer 12 laminated on the insulating film 11 as shown in FIG. 2(a).

The conductive metal layer 12 may be produced by bonding a conductive metal foil, such as copper or aluminum foil, on the insulating film with an adhesive layer. Alternatively, a metal, such as nickel or chromium, may be deposited in small amounts on the insulating film 11 through sputtering or similar means and the resultant metal layer may be covered with a metal deposit, such as of copper, by electroless plating or electroplating.

The thus-formed conductive metal layer 12 usually ranges in thickness from 1 to 35 μm, and preferably from 8 to 35 μm.

After the conductive metal layer 12 has been formed on the insulating film 11, a photosensitive resin 16 is applied on the surface of the laminate (on the conductive metal layer 12). The coating of photosensitive resin 16 is then photo-exposed in a desired pattern and developed by removing the non-cured resin. As a consequence, the cured photosensitive resin 16 forms a desired pattern 17a on the surface of the conductive metal layer as shown in FIG. 2(c).

Selectively etching the conductive metal layer 12 using the pattern 17a as a masking material will form a desired wiring pattern 13 as shown in FIG. 2(d).

Since a part of the leads 15 will be electroplated in a later step to produce a tin-bismuth alloy deposit 19, the wiring pattern 13 formed in the film carrier tape 10 is connected with a current supply wiring 22 which supplies electric current to the wiring pattern 13 to effect electroplating with a tin-bismuth alloy. The current supply wiring 22 is formed straight in the longitudinal direction of the insulating film 11, inward and along sprocket holes 20 provided in edge portions on both sides of the insulating film 11.

After the conductive metal layer 12 has been selectively etched, the resultant wiring pattern 13 will be covered with a solder resist layer 17 in entire surface but the areas corresponding to the lead portions 15 as shown in FIG. 2(e). The solder resist layer 17 is formed to protect the wiring pattern 13 between inner leads 15a to connect with electrodes of electronic devices and outer leads 15b to connect the film carrier with outside devices. The solder resist layer 17 will not be formed on the current supply wiring 22. The coating solution of solder resist used herein will be a high-viscosity ink obtained by dissolving or dispersing a thermosetting resin in an organic solvent. The coating will be usually carried out by a screen printing technique. Instead of using the coating solution of solder resist, the solder resist layer 17 may be formed by bonding a heat resistant film having a hot-melt adhesive layer. In this case, the heat resistant film will be applied after shaped to a desired contour.

After the solder resist layer 17 has been thus formed, the wiring pattern 13 exposed from the solder resist layer 17 is plated as shown in FIG. 2(f).

In the invention, the wiring pattern 13 exposed from the solder resist layer 17 will be preferably covered in the overall surface with a tin deposit 18 before selected portions thereof are plated with a tin-bismuth alloy. To form the tin deposit 18, electroplating or electroless plating may be employed. In the invention, the tin deposit 18 will be preferably formed by electroless plating. The tin deposit 18 generally ranges in thickness from 0.1 to 1 μm. Conventional plating conditions may be employed to form the tin deposit 18.

After the tin deposit 18 has been formed, a tin-bismuth alloy deposit 19 is formed on the surface of the tin deposit 18 as shown in FIGS. 2(g) and (h).

The tin-bismuth alloy deposit 19 will be formed only on the outer leads 15b and usually not on the inner leads 15a. To form the tin-bismuth alloy deposit 19 in such a selective manner, the insulating film 11 will be carried in a standing condition into a plating tank so that the wiring pattern within a certain distance from the side edge of the insulating film 11 will be soaked in the plating solution for forming a tin-bismuth alloy deposit. Thus, portions soaked in the plating solution may be selectively plated. This plating method will be referred to as the partial plating by solution surface level control.

In the partial plating by solution surface level control, the insulating film 11 is stood up with one edge down (the side C in FIG. 2(g) where the formation of the tin-bismuth alloy deposit 19 is intended) so that the outer leads 15b on that side will be soaked in the plating solution. An electric current is supplied from the current supply wiring 22 and the outer leads 15b soaked in the plating solution is plated. Thereafter, the insulating film 11 is turned upside down so that the side D in FIG. 2(h) is soaked in the plating solution. An electric current is supplied from the current supply wiring 22 and the outer leads 15b soaked in the plating solution is plated.

FIGS. 4 and 5 illustrate an apparatus suitable for carrying out the partial plating by solution surface level control.

FIG. 4 is a top view showing an embodiment of the plating apparatus, and FIG. 5 is a partially cutaway side view showing the plating apparatus.

As illustrated in FIGS. 4 and 5, the plating apparatus includes a plating tank 42 in which a plating solution 41 is contained, a slit inlet opening 50 through which a film carrier tape 10 is successively carried into the plating tank 42, a slit outlet opening 51 through which the film carrier tape 10 is carried out from the plating tank, and a washing nozzle 61 for washing with water the film carrier tape which has exited the plating tank through the slit outlet opening.

The plating tank 42 has a box shape, generally rectangular in cross section, and is long laterally along the traveling direction of the film carrier tape 10 to be plated.

At a sidewall 43 upstream of the traveling direction of the film carrier tape 10, the plating tank 42 has the slit inlet opening 50 through which the film carrier tape 10 is continually entering the plating tank 42. At a sidewall 44 downstream of the traveling direction of the film carrier tape 10, the plating tank 42 has the slit outlet opening 51 through which the film carrier tape 10 exits the plating tank 42.

The slit inlet opening 50 and the slit outlet opening 51 are both capable of keeping a minimum leakage of the plating solution 41 from the plating tank 42. In order that the film carrier tape 10 can be carried in the plating tank 42 and carried out therefrom with a minimum leakage of the plating solution, these openings have elastic part (not shown) with a sufficient chemical resistance that pinches the film carrier tape 10. Upstream from the slit inlet opening 50 lies a plating electricity supplying device 53 which supplies an electric current needed for the plating to the current supply wiring 22. Thus, the film carrier tape 10 carried in the plating tank 42 is electroplated. Preferably, the plating electricity supplying device 53 is always in contact with the current supply wiring 22 of the film carrier tape being carried into the plating tank. Generally, a conductive metal roller is used as the plating electricity supplying devices 53 and may also function as conveyance means to convey the film carrier tape.

Inside of sidewalls 45 and 46 (the longer sidewalls) of the plating tank 42 that extend substantially parallel to the traveling direction of the film carrier tape 10, anodes 47 are arranged a certain distance apart from the film carrier tape 10 as a cathode.

The anodes 47 also function to supplement the tin consumed during the plating, thereby keeping the tin concentration constant in the plating solution. The tin anodes are generally composed of a relatively pure tin metal. In general, a tin content in the tin electrodes is 99.5 to 99.9%.

The plating solution contains bismuth, which will readily substitute with tin atoms on the surface of the tin metal in an acidic condition. Therefore, if the tin electrodes alone used as the anodes, a composition of the tin-bismuth plating solution may be unstable due to substitution of tin on the surface of the anodes with the bismuth. Since the consumption of tin in the tin-bismuth plating solution has to be covered by the elution of tin from the tin metal anodes, the anodes are preferably composed of tin metal electrodes 55a and electrodes (insoluble anodes) 55b which will not dissolve in the plating solution 41. The area of insoluble anodes 55b is preferably 10 to 30% of the total area of the tin metal electrodes 55a and the insoluble anodes 55b. The tin metal electrodes 55a and the insoluble anodes 55b are preferably arranged separately in the longitudinal direction of the plating tank 42. A voltage can be applied between the anodes 55 and the plating electricity supplying devices 53. The plating electricity supplying devices 53 is electrically connected with the plating current supply wiring 22 formed in the film carrier tape 10. Therefore, the wiring pattern formed in the film carrier tape 10 can be used as cathodes while the tin metal electrodes 55a and the insoluble anodes 55b are used as anodes. Thus, the tin-bismuth alloy deposit 19 may be formed on the wiring pattern which is in contact with the plating solution. The plating apparatus has a part from which the plating solution overflows at a certain height for keeping a surface level of the plating solution at a constant (not shown). Adjusting the height of the part allows control of the level of the plating solution in the plating tank 42.

After the tin-bismuth alloy deposit 19 has been thus formed, the film carrier tape 10 exits the plating tank 42 through the slit outlet opening 51. In general, the film carrier tape is washed with water in a washing tank 60 thereafter. However, arrangement of the plating tank 42 and the washing tank 60 inevitably produces a certain distance between them. As a consequence, it will generally take at least 7 seconds, and often 10 and several seconds, until the film carrier tape 10 which has exited the plating tank 42 is washed in the washing tank 60.

The plating solution of tin-bismuth alloy still remains on the surface of the film carrier tape which has exited the plating tank 42. Bismuth in the plating solution remaining on the surface of the film carrier tape may substitute with tin in the tin-bismuth alloy deposit formed. Therefore, a bismuth concentration near the surface of the alloy deposit tends to be high. The substitution of tin on the surface of the tin-bismuth alloy deposit with bismuth may cause a change of surface color of the alloy deposit before the corresponding part of the film carrier tape enters the washing tank 60.

It was found that the substitution between bismuth and tin starts to proceed at 6 seconds after the film carrier tape has exited the plating tank 42. That is, the bismuth substitution will not substantially take place if the plating solution could be washed away within 6 seconds, and preferably within 5 seconds, after the film carrier tape has exited the plating tank 42.

The plating apparatus according to the invention is provided with a washing nozzle 61 which performs the washing of the film carrier tape 10 carried out from the plating tank 42 through the slit outlet opening 51 before the film carrier tape 10 reaches the washing tank 60. The washing nozzle 61 should be arranged to be able to wash off at least the plating solution remaining on the wiring pattern of the film carrier tape 10. At least two washing nozzles will be preferably provided to wash both surfaces of the film carrier tape 10 at the same time because the surface with the wiring pattern turns around depending on the standing condition of the film carrier tape 10 carried out through the slit outlet opening 51, and flowing of the plating solution to the back surface of the film carrier tape 10 through the holes formed in the tape, such as sprocket holes or device holes, may possibly occur. The washing nozzles 61 are positioned so that the film carrier tape 10 can be washed within 6 seconds, preferably within 5 seconds, after the corresponding part of the film carrier tape exits the plating tank 42 through the slit outlet opening 51. Preferably, the washing nozzles 61 are directed to eject water toward the traveling direction of the film carrier tape 10. To allow for appropriate adjustment of the ejection point and the ejection angle of water with respect to the film carrier tape 10, each washing nozzle 61 is preferably provided in connection with a bellows flexible tube. The washing nozzle may be arranged at the tip of the bellows flexible tube. A feed rate of water from the washing nozzles 61 is suitably 10 to 500 ml/sec, and preferably 30 to 300 ml/sec. A water pressure therefrom is suitably 0.05 to 0.8 $kgf/cm^2$, and preferably 0.2 to 0.5 $kgf/cm^2$. By adjusting the feed rate and the water pressure within the above ranges, the plating solution remaining on the film carrier tape 10 may be effectively washed off without deforming the wiring pattern, particularly the connection leads.

To prevent the water ejected from the washing nozzles 61 from scattering, the plating apparatus 40 is preferably provided with receivers 62 which extend aside from both surfaces of the film carrier tape 10 in the parallel direction. Since the washing nozzles 61 eject washing water along the traveling direction of the film carrier tape 10, the receivers 62 will be provided at any downstream point of the traveling direction of the film carrier tape 10 past the washing nozzles 61. The receivers 62 can be arranged to connect the plating tank 42 with the washing tank 60. The width between the receivers 62 is nearly equal to or greater than the width of the film carrier tape 10 to be washed. By impinging on the receivers 62, the water can be prevented from scattering around, and the removal of the plating solution remaining on the film carrier tape 10 can be enhanced.

The washing water ejected from the washing nozzles 61 is collected for disposal in a water collection device (not shown) positioned below the receivers 62.

As described above, the film carrier tape 10 can be washed with the jet of washing water applied from the washing nozzles 61 within 6 seconds, preferably within 5 seconds, after the film carrier tape 10 exits the plating tank 42. Since the plating solution can be almost completely removed from the film carrier tape 10 in such a short period of time, the substitution between tin on the surface of the tin-bismuth alloy deposit 19 formed on the connection leads and bismuth in the plating solution remaining on the alloy deposit 19 can be effectively prevented. As a consequence, a bismuth content in the tin-bismuth alloy deposit formed on the lead portion of the film carrier tape will be substantially homogeneous along its thickness direction. That is, the composition of the tin-bismuth alloy is constant at any portion of the tin-bismuth alloy deposit. Therefore, the melting point of the tin-bismuth alloy will not fluctuate and stable bonding properties can be obtained all the time.

As such, the composition in the tin-bismuth alloy deposit 19 formed to the film carrier tape of the invention is constant. That is, the bismuth content in the vicinity of the surface of the tin-bismuth alloy deposit 19 is substantially the same with that deep inside thereof. Therefore, stable bonding properties can be obtained.

The tin-bismuth alloy deposit usually ranges in thickness from 0.2 to 20 μm, and preferably from 2 to 15 μm.

Concentrations of tin and bismuth in the plating solution used for the plating of the tin-bismuth alloy may be the same with those known in the art. Preferably, the bismuth concentration is set in the range of 0.5 to 50 wt %, and particularly preferably 13 to 20 wt % with respect to the plating solution.

Generally, the tin-bismuth alloy deposit 19 is formed selectively on the outer leads of the film carrier tape. That is, as shown in FIG. 3, the inner leads are connected with gold bumps formed on electronic devices in most cases. The gold bump electrodes of electronic devices and tin deposits formed on the inner leads are bonded together with a gold-tin eutectic crystal formed. Therefore, the tin deposit formed on the inner leads 15a can be used without further processing. Contrary, the outer leads 15b need to be provided with a metal layer that will fuse at a certain low temperature since the outer leads 15b are electrically connected with various kinds of wirings.

As such, the outer leads 15b need to be provided with a tin-bismuth alloy deposit having a constant melting point to electrically connect with various kinds of wirings. Therefore the tin-bismuth alloy deposit 19 should have a uniform bismuth content over all of the deposit. To achieve this requirement, the plating solution remaining on the tin-bismuth alloy deposit 19 has to be washed off before a substitution reaction between bismuth in the plating solution and tin in the alloy deposit 19 proceeds. The film carrier tape is washed to remove the plating solution within 6 seconds, and preferably within 5 seconds after the film carrier tape exits the plating tank through the slit outlet opening.

After the plating solution remaining on the surface of the film carrier tape has been washed off, the film carrier tape 10 is carried into the washing tank 60 and further washed.

After the tin-bismuth alloy deposit 19 has been formed on the outer leads 15b on an edge portion of one side of the insulating film 11 by the solution surface level control, the tin-bismuth alloy deposit 19 is formed on the outer leads 15b on the opposite edge portion of the insulating film 11 in a similar procedure as described above. To accomplish this converse side plating, the film carrier tape which has been washed in the washing tank 60 will be stood upside down, i.e., so that the edge portion of the insulating film where the tin-bismuth alloy deposit 19 is newly desired positions downward. Thereafter, the outer leads 15b on that side of the film carrier tape are soaked in the plating solution 41. Also in this case, the plating solution remaining on the film carrier tape will be washed off with the water jet applied from the washing nozzles 61 within 6 seconds, and preferably within 5 seconds after the plating with the tin-bismuth alloy has been completed.

In the resulting film carrier, the tin-bismuth alloy deposit 19 is formed on the outer leads 15b positioned adjacent to the sprocket holes formed on both edge portions along the width direction of the insulating film 11. On the other hand, the tin deposit is formed on the inner leads 15a positioned near the center of the film carrier.

When a bismuth content is measured along the thickness direction of the tin-bismuth alloy deposit 19 formed on the outer leads 15b, the bismuth content is substantially the same between at the surface of and at deep inside the tin-bismuth alloy deposit 19. That is, there is substantially no heterogeneous distribution of bismuth within the deposit. Accordingly, the melting point will not vary substantially from the surface to deep inside of the tin-bismuth alloy deposit 19.

The tin-bismuth alloy deposit 19 is formed on the lead portions so as to attain a substantially uniform bismuth content in the deposit. Generally, when a layer of metal or alloy is laminated on the other layer of metal or alloy, a diffusion of metal may occur naturally between the layers. However, in the film carrier tape according to the invention, a variation of the bismuth content in the deposit due to such natural diffusion of metal will be ignored to interpret "uniform" bismuth content in the deposit.

In the plating apparatus described above, the standing film carrier tape is soaked in the level-controlled plating solution so that the tin-bismuth alloy deposit can be selectively formed on the connection leads in the vicinity of the longitudinal edge portions of the film carrier tape. However, the plating apparatus of the invention is not limited to this embodiment where the standing film carrier tape is plated on selected parts, and, needless to say, it is possible to carry out the plating process of the invention on the entire surface without the solution surface level control. It is also possible to arrange the slit inlet opening and the slit outlet opening parallel to the surface level of the plating solution. Although the plating apparatus of the invention has been described based on the embodiment where the plating solution for plating the tin-bismuth alloy is charged in the plating tank, the plating solution which can be charged in the plating tank is not limited thereto, and any plating solutions commonly employed in the electroplating and the electroless plating of such as nickel, gold, palladium, tin and tin-lead alloy, may be used. The plating apparatus of the invention may be favorably used with these plating solutions since it is desirable that these plating solutions are washed off as soon as possible after a plated article is carried out from the plating tank.

The tin-bismuth alloy plating solution for use in the production method of the film carrier tape may be that conventionally employed. For example, an Sn—Bi plating solution may be employed that has a tin concentration of 50 to 60 g/l (in terms of metal) and a bismuth concentration of 20 to 40 g/l (in terms of metal) in a sulfuric acid aqueous solution. Also, the tin-bismuth alloy plating solution may contain a surfactant, methanol or the like.

EXAMPLES

The film carrier tape, the production method thereof, and the plating apparatus according to the invention will be described in detail by the following Examples. But it should be understood that the invention is in no way limited to those Examples.

Example 1

A polyimide film (UPILEX®-S available from UBE INDUSTRIES, LTD.), which was 50 μm in average thickness, 48 mm in width and 120 m in length, was perforated to produce a number of sprocket holes in the vicinity of edge portions in the width direction.

Thereafter, as shown in FIG. 2(a), an electrodeposited copper foil having an average thickness of 25 μm was bonded onto the polyimide film. The electrodeposited copper foil was coated with a photosensitive resin as shown in FIG. 2(b) and photoexposed. Developing the photoexposed resin produced a pattern as illustrated in FIG. 2(c).

The thus-formed pattern was used as a masking material while the electrodeposited copper foil was etched to produce a wiring pattern of copper as illustrated in FIG. 2(d). The masking material (photoexposed resin) was removed by alkali cleaning.

Then, an entire surface of the wiring pattern was coated with a solution of solder resist but the areas corresponding to inner and outer leads as shown in FIG. 2(e). The solution was thereafter dried and cured to produce a solder resist layer.

The tape produced as above was drawn out from a reel and fed into a plating tank containing a tin solution. According to a common procedure, lead portions of the film carrier were electroless plated and a tin deposit with an average thickness of 0.43 µm was formed. Then the film carrier tape was exited from the tin-plating tank, washed with water, dried and wound to a reel together with an embossed tape as a spacer.

The film carrier tape was drawn out from the reel and entered a plating tank of the plating apparatus illustrated in FIG. 4 through a slit inlet opening. The slit inlet opening was formed so that the film carrier tape enters the plating tank in perpendicular direction to the surface of plating solution. Inside the plating tank was provided a solution level controlling part which controls the depth of the plating solution by allowing the solution to overflow at an appropriate level. A level of the surface of the plating solution was controlled so that the film carrier tape standing with left edge up (as shown in FIG. 2(g)) would be soaked from right edge to the broken line C in FIG. 2(g) when carried into the plating tank.

Tin electrodes composed of 99.9% pure tin and titanium electrodes insoluble in the plating solution was arranged in the plating tank. The tin electrodes and the titanium electrodes had an area occupying 70% and 30% respectively based on the total area of anodes soaked in the plating solution (100%).

The plating solution was prepared to obtain an Sn-16% Bi alloy deposit and had a fundamental composition of:
Tin concentration (in terms of metal): 55 g/l
Bismuth concentration (in terms of metal): 36 g/l A plating electricity supplying device provided outward the slit inlet opening was operated to supply electricity necessary for plating with a current supply wiring formed in the film carrier tape. A voltage was applied between the anodes and the film carrier tape entered in the plating tank through the slit inlet opening. As a consequence, a tin-bismuth alloy deposit was formed with an average thickness of 6 µm on the outer leads soaked in the plating solution.

After the tin-bismuth alloy deposit was formed with the solution surface level control as described above, the film carrier tape was exited through the slit outlet opening. The film carrier tape was washed with water using two washing nozzles within one second after exiting through the slit outlet opening. To prevent the splash of water ejected from the two washing nozzles, receivers consisting of an acrylic resin plate were arranged in the vicinity of the washing nozzles along the film carrier tape.

A feed rate of water for each of the two washing nozzles was 120 ml/sec, and water pressure was 0.3 kgf/cm$^2$.

After the film carrier tape was washed with water using the washing nozzles, it was entered in a washing tank for further washing, then dried and wound on a wind-up reel together with an embossed tape as a spacer.

A time period required for the film carrier tape to enter the washing tank after exiting the plating tank through the slit outlet opening was 10 seconds.

Thereafter, the film carrier tape wound on the wind-up reel was set in the plating apparatus illustrated in FIG. 4. Then the film carrier tape was drawn out from the wind-up reel and entered the plating tank through the slit inlet opening. The film carrier tape was set to stand with the right edge up (as seen in FIG. 2(h)) and soaked in the plating solution from the left edge up to the broken line D in FIG. 2(h). The plating was carried out under similar conditions as described above. As a consequence, a tin-bismuth alloy deposit was formed in an average thickness of 6 µm on the wiring pattern soaked in the plating solution.

Subsequently, the film carrier tape exited the plating tank through the slit outlet opening. The film carrier tape was washed with water using two washing nozzles within one second after exiting the plating tank through the slit outlet opening. Thereafter, the film carrier tape entered the washing tank for further washing, then was dried and wound on a reel together with an embossed tape as a spacer.

A surface color of the lead portions was observed immediately after the plating was completed and after the film carrier tape washed in the washing tank had been dried. These surface colors showed little difference and recognized to be identical.

Comparative Example 1

A film carrier tape was produced according to the same procedure with Example 1 except that the film carrier which exited the plating tank through the slit outlet opening directly entered the washing tank without being washed with water by means of the washing nozzles. The film carrier tape which exited the plating tank through the slit outlet opening was subjected to contact with the plating solution remaining on the tape for 8 seconds before it reached the washing tank.

During the travel between the plating tank and the washing tank, the tin-bismuth alloy deposit was observed to turn darker.

Examples 2–6 and Comparative Examples 2–3

Film carrier tapes were produced according to the same procedure as Example 1 except that the film carrier tapes which exited the plating tank through the slit outlet opening were subjected to contact with the plating solution remaining on the tapes for 2 seconds (Example 2), 3 seconds (Example 3), 4 seconds (Example 4), 5 seconds (Example 5), 6 seconds (Example 6), 7 seconds (Comparative Example 2), or 8 seconds (Comparative Example 3) before they were washed with water by means of the washing nozzles.

In Examples 2 to 4, a surface color of the tin-bismuth alloy deposit did not change during the travel from the plating tank to the washing tank. In Example 5, a part of the surface color of the tin-bismuth alloy deposit seemed to have very slightly changed. In Example 6, slight change of surface color was partially observed on the tin-bismuth alloy deposit.

On the other hand, the tin-bismuth alloy deposits formed in Comparative Examples 2 and 3 showed darkening of the surface before washed with water ejected from the washing nozzles. The darkness in the surface of the tin-bismuth alloy deposits did not come off even after washing in the washing tank.

Furthermore, the bismuth content was measured for the tin-bismuth alloy deposits formed on the lead portions. As a result, bismuth contents from the surface to the inside of the deposits of Examples 2 to 4 were found to be substantially uniform.

Contrary, the deposits of Comparative Examples 2 and 3 were found to contain bismuth in higher content near the surface than inside of the deposits. These results corresponded to the occurrence of darkening on the surface.

The invention claimed is:

1. A production method of a film carrier tape for mounting electronic devices thereon which comprises:
    plating at least a part of a wiring pattern formed on an insulating film with a tin-bismuth alloy plating solution in a plating tank, with the insulating film being stood up with one edge down;
    ejection washing the portion of the wiring pattern plated with the tin-bismuth alloy to remove the plating solution from the wiring pattern within 6 seconds after the stood-up film carrier tape exits the plating tank through a slit outlet opening by ejecting water from a washing nozzle; and subsequently
    moving the film carrier tape to a washing tank to further wash the film carrier tape.

2. The production method according to claim 1, wherein the plating is conducted by contacting at least a part of the stood-up film carrier tape with a plating solution in the plating tank to form a tin-bismuth alloy deposit on at least a part of the wiring pattern.

3. The production method according to claim 1, wherein the water is ejected from the washing nozzle along the traveling direction of the film carrier tape, and the film carrier tape moves between receivers which extend aside from both surfaces of the film carrier tape in a parallel direction and are provided at a downstream point of the washing nozzle with respect to a traveling direction of the film carrier tape.

4. The production method according to claim 2, wherein the water is ejected from the washing nozzle along the traveling direction of the film carrier tape, and the film carrier tape moves between receivers which extend aside from both surfaces of the film carrier tape in a parallel direction and are provided at a downstream point of the washing nozzle with respect to a traveling direction of the film carrier tape.

* * * * *